US008833185B2

(12) United States Patent
Auberger et al.

(10) Patent No.: US 8,833,185 B2
(45) Date of Patent: Sep. 16, 2014

(54) CONTROL PANEL COMPRISING RESISTIVE KEYS AND SPACERS

(75) Inventors: Stephane Auberger, Les Bordes (FR); Roland Lobstein, Illkirch (FR)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 14/006,379

(22) PCT Filed: Mar. 12, 2012

(86) PCT No.: PCT/EP2012/054214
§ 371 (c)(1), (2), (4) Date: Sep. 20, 2013

(87) PCT Pub. No.: WO2012/126754
PCT Pub. Date: Sep. 27, 2012

(65) Prior Publication Data

US 2014/0007707 A1 Jan. 9, 2014

(30) Foreign Application Priority Data

Mar. 21, 2011 (FR) ..................................... 11 52302

(51) Int. Cl.
*G01L 1/04* (2006.01)
*H03K 17/96* (2006.01)
*G01L 1/22* (2006.01)
*G01L 1/20* (2006.01)

(52) U.S. Cl.
CPC .......... *G01L 1/2287* (2013.01); *H03K 17/9625* (2013.01); *G01L 1/205* (2013.01)
USPC ..................................................... 73/862.629

(58) Field of Classification Search
USPC ..................................................... 73/862.629
See application file for complete search history.

(56) References Cited

U.S. PATENT DOCUMENTS

| | | | | |
|---|---|---|---|---|
| 4,555,954 | A | 12/1985 | Kim | |
| 4,584,625 | A * | 4/1986 | Kellogg | 361/283.1 |
| 7,772,960 | B2 * | 8/2010 | Baker | 338/99 |
| 2002/0000979 | A1 | 1/2002 | Furuhashi et al. | |
| 2003/0107556 | A1 | 6/2003 | Yamashita | |
| 2006/0007172 | A1 | 1/2006 | Baker et al. | |
| 2006/0066589 | A1 | 3/2006 | Ozawa et al. | |

FOREIGN PATENT DOCUMENTS

| | | | |
|---|---|---|---|
| GB | 2 180 994 | A | 4/1987 |
| WO | 2009/070503 | A1 | 6/2009 |

OTHER PUBLICATIONS

International Search Report dated Jun. 6, 2012.

* cited by examiner

*Primary Examiner* — Lisa Caputo
*Assistant Examiner* — Octavia D. Hollington
(74) *Attorney, Agent, or Firm* — Lawrence D. Hazelton

(57) ABSTRACT

Control panel including a cover mounted on a support that is provided with a tactile pressing detection zone in which a force sensor that includes a pressure-sensitive zone is arranged behind a detection zone between the cover and the support so as to produce an electrical control signal when a user applies a determined tactile pressing force to the detection zone. The tactile pressing force is transmitted axially (X1) towards the sensitive zone via a spacer made of elastically compressible material interposed between the sensor and the cover. The spacer includes at least one compressible portion that defines a transversal top surface that bears against the cover and a transversal bottom surface that bears against the sensitive zone of the sensor. The top surface has an area smaller than the area of the bottom surface.

15 Claims, 6 Drawing Sheets

CONTROL PANEL COMPRISING RESISTIVE KEYS AND SPACERS

CROSS-REFERENCE TO RELATED APPLICATION

This application claims the benefit under 35 U.S.C. §371 of published PCT Patent Application Number PCT/EP 2012/054214, filed Mar. 12, 2012 and claims priority to French Patent Application 1152302 filed Mar. 21, 2011, and published as WO2012/126754 Sep. 27, 2012, the entire contents of which is hereby incorporated by reference herein.

TECHNICAL FIELD OF INVENTION

The present invention relates to a control panel, particularly for a motor vehicle, including resistive keys.

BACKGROUND OF INVENTION

The present invention relates more particularly to a control panel intended to be arranged in the passenger space of a motor vehicle, particularly on the dashboard, and which includes at least one control button in the form of a resistive key designed to control a determined function, for example to control the starting or stopping of the air-conditioning function.

The control panel includes a cover that is mounted on a support and which is provided with or configured to define at least one detection zone to form a control button. A force sensor is arranged between the cover and the support, and positioned behind the detection zone, so as to produce an electrical control signal when a user applies a sufficient pressing force to the detection zone.

To compensate for or avoid mechanical play or looseness between the force sensor and the detection zone, it is known to arrange a spacer, in the form of a plate of elastomeric material, between the force sensor and the cover to ensure under all circumstances the direct transmission of the tactile pressing force to the force sensor via the spacer. To this end, the spacer is mounted or arranged to be axially compressed between the force sensor and the cover.

To allow detection of the tactile pressing, it is necessary for the thickness of the cover in the detection zone to be relatively small so as to permit a slight elastic deformation of the cover towards the sensor during the tactile pressing. However, the mounting or arranging of the spacer to be in compression between the sensor and the cover tends to cause an outward deformation of the cover at the level of the spacer that detracts from the external appearance of the cover. Moreover, the distribution of the pressure over the spacer is not even, the greatest amount of pre-load or pressing generally occurring on the outer peripheral edge or perimeter of the spacer.

These disadvantages are particularly problematic in applications subject to large temperature variations, as in a motor vehicle, which can lead to a loss of pressure or pre-load on the spacer.

SUMMARY OF THE INVENTION

The present invention is intended to remedy the disadvantages mentioned above by proposing a simple, effective, and economical solution.

To this end, the invention proposes a control panel, particularly for a motor vehicle, including a cover which is mounted on a support and which is provided with at least one tactile pressing detection zone forming a control button, in which a force sensor having a pressure-sensitive zone is arranged between the cover and the support, behind the detection zone, so as to detect the actuation of the control button to produce an electrical control signal when a user applies a determined tactile pressing force to the detection zone, the tactile pressing force being transmitted axially towards the sensitive zone via a spacer made of elastically compressible material that is interposed between the sensor and the cover, the spacer being mounted axially compressed between the sensor and the cover in the absence of tactile pressing on the detection zone so that the sensor is subject to a prestressing force at rest, characterized by the fact that the spacer includes at least one compressible portion provided with a transversal top surface which bears against the cover and with a transversal bottom surface which bears against the sensitive zone of the sensor, the top surface having an area smaller than the area of the bottom surface so as to minimize the reaction force applied by the spacer to the cover while ensuring even distribution of the prestressing force and of the tactile pressing force over the sensitive zone of the sensor.

By means of the invention, the contact surface between the spacer and the cover is minimized which allows reduction of the stresses applied to the cover. The invention permits application of a prestressing force to the sensor which is less than the prestressing force applied to the sensor by a conventional spacer in the form of a parallelepipedal slab of uniform axial thickness, while guaranteeing that there is always a minimum prestressing force despite manufacturing and assembly tolerances and despite temperature variations.

By minimizing the intensity of the nominal prestressing force, the invention permits reduction of risks of creep due to too great pressing forces at the sensor and at the cover. Moreover, the smaller the prestressing force, the easier will be the detection of the activation of the associated control button.

In accordance with other advantageous characteristics: the detection zone includes a back-lit zone which is designed to be back-lit through the spacer, and the spacer includes a central cavity for the axial passage of light towards the illumination zone; the central cavity corresponds to a through hole arranged in the spacer; the spacer includes at least one transversal passage which communicates the inside of the central cavity with the outside of the spacer; the sensitive zone generally has an annular form which defines a central space the form of which generally corresponds to the form of the central cavity in order to facilitate the passage of light through the force sensor; the spacer includes a single compressible portion generally in the form of a truncated cone; the spacer includes a plurality of compressible portions; the compressible portions are distributed substantially parallel with the outer contour of the sensitive zone of the sensor; the sensitive zone generally has a rectangular outer contour and the spacer includes, opposite the sensitive zone, two compressible portions which extend in the length of the sensitive zone and two compressible portions which extend in the width of the sensitive zone; each compressible portion generally has the form of a truncated and elongate pyramid having trapezoidal lateral faces and a generally rectangular top surface; the compressible portions associated with a determined sensitive zone have distinct axial thicknesses matched to the height variations of the cover relative to the sensor; the spacer and the sensor are mounted axially compressed between the cover and an intermediate plate which is directly fixed onto the cover, independently of the support; the spacer is made in one piece with a transversal spacer plate and the spacer plate is provided with positioning means which ensure centering of the spacer opposite the associated sensitive zone and opposite the associated detection zone; the spacer plate includes a plurality of spacers which are associated respectively with a plurality of detection zones; and a plate made of more rigid material than the material forming the spacer is interposed between the spacer and the sensitive zone of the sensor in order to contribute to even distribution of the prestressing force and of the tactile pressing force over the sensitive zone of the sensor.

BRIEF DESCRIPTION OF DRAWINGS

Other characteristics, aims and advantages of the invention will become apparent on reading the following detailed description, with reference to the attached drawings, given by way of non-limiting example and in which.

DETAILED DESCRIPTION

In the remainder of the description, identical or similar elements will be designated by identical references.

Figure 1:
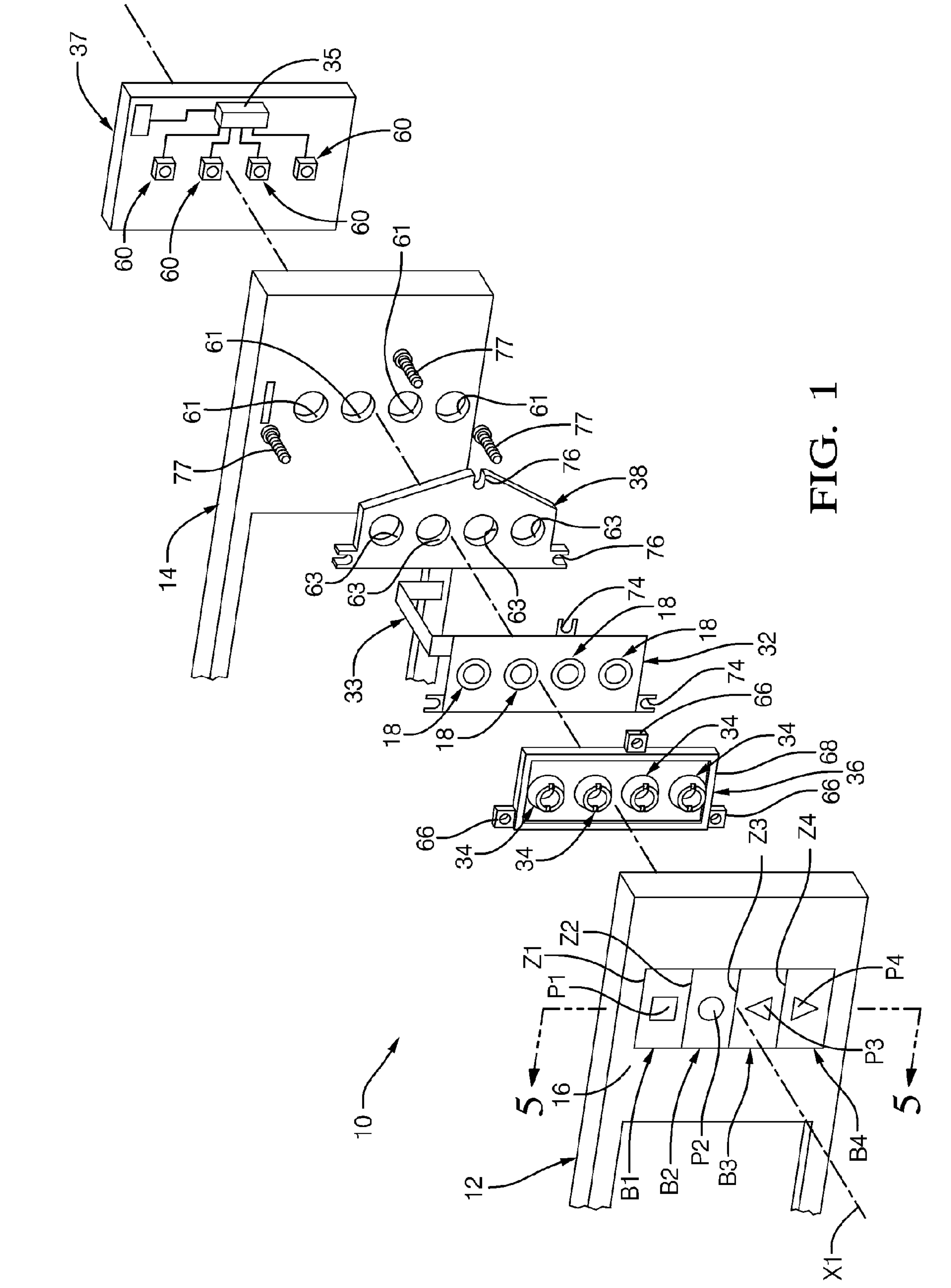
FIG. 1 is an exploded view in perspective that shows diagrammatically a control panel fitted with resistive keys provided with force sensors and spacers in accordance with a first embodiment of the invention in which each spacer is formed of an compressible portion in the form of a truncated cone.

FIG. 1 shows a control panel 10 for a motor vehicle dashboard, made in accordance with a first embodiment in accordance with the teachings of the invention. It here includes a cover 12 which is mounted on a support 14, the outer surface 16 of the cover 12 including a plurality of tactile pressing detection zones Z1, Z2, Z3, Z4 forming a plurality of control buttons B1, B2, B3, B4, or resistive keys. In accordance with the example shown here, the resistive keys are four in number. Preferably, each control button B1, B2, B3, B4 is provided with a pictogram P1, P2, P3, P4 designed to be back-lit. The pictograms P1, P2, P3, P4 are created for example by laser scraping on the outer face 16 of the cover 12 and thus form back-lighting zones.

In the remainder of the description by way of non-limiting example an axial orientation will be used along an axis X1 substantially at right-angles to the general plane of the cover 12, orientated from the front towards the rear, i.e. from the cover 12 towards the support 14, which corresponds generally to an orientation from left to right considering FIG. 1.

Each control button B1, B2, B3, B4 here includes a force sensor 18 that is arranged between the cover 12 and the support 14, behind and axially opposite the associated detection zone Z1, Z2, Z3, Z4. Each force sensor 18 is designed to detect the actuation of the associated control button B1, B2, B3, B4 and to produce an electrical control signal when a user applies a tactile pressing force of sufficient intensity to the associated detection zone Z1, Z2, Z3, Z4.

In accordance with an advantageous characteristic of the invention, each force sensor 18 is of the type with variable resistance as a function of the force, for example of the FSR (Force Sensing Resistor) type as described and shown in the documents US2006/0007172A1 and WO2009/070503A1.

Figure 2:
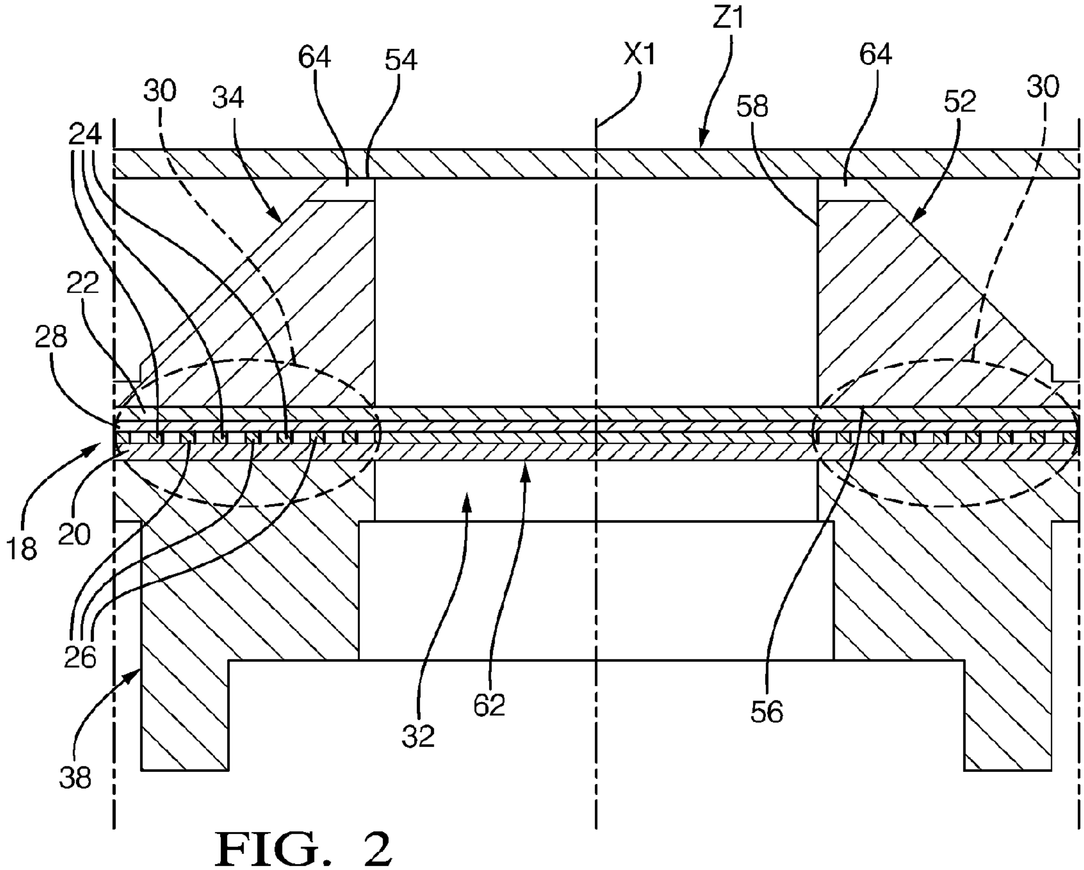
FIG. 2 is a partial view in axial section along the plane 2-2 that diagrammatically shows the structure of a force sensor and of a spacer with which the control panel of FIG. 1 is fitted.
Figure 3:
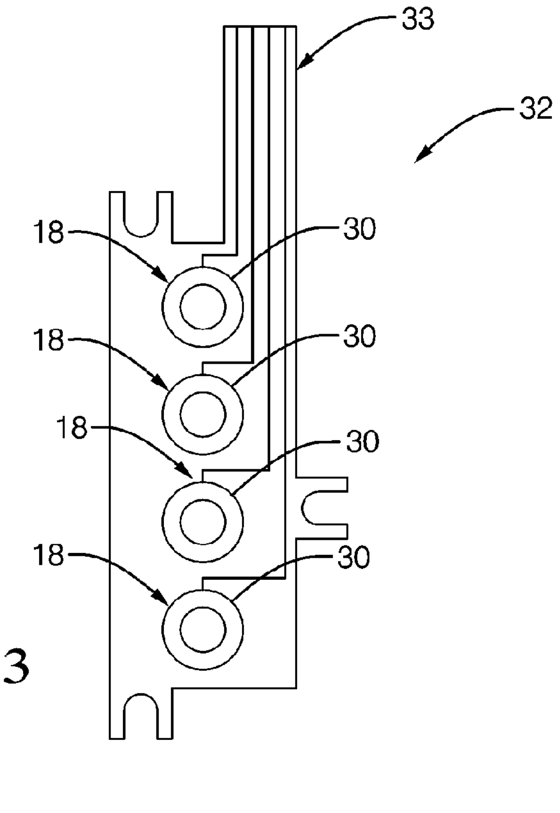
FIG. 3 is a view from above that shows diagrammatically a film carrying a plurality of force sensors designed to be fitted to the control panel of FIG. 1.

Preferably, a force sensor 18 is used here mounted under mechanical prestress, as shown in FIGS. 2 and 3. The force sensor 18 here includes a first 20 and a second 22 substrate at least one of which is flexible when a tactile pressing force is applied to the associated detection zone Z1. Conductive electrical tracks 24, 26 are arranged, for example in the form of interdigitated combs, on a face of the first substrate 20 opposite a resistive coating 28 arranged on the opposite face of the second substrate 22, so as to define a pressure-sensitive zone 30, here of annular form, which is generally opposite the associated detection zone Z1. In the rest state of the force sensor 18, in the absence of a tactile pressing force, the resistive coating 28 is in electrical contact with portions of conductive tracks 24, 26.

In accordance with the example shown, the four control buttons B1, B2, B3, B4, B5, B6 being positioned substantially adjacently on the cover 12, it is possible to arrange the four associated force sensors 18 on the same substrates 20, 22. Thus, as shown in FIGS. 1 and 3, the force sensors 18 are in the form of a film 32 including an electrical connecting ribbon 33 designed to allow the connecting of the four sensors 18 to an electronic control unit 35 arranged on a printed circuit board 37, behind the support 14.

In accordance with the embodiment shown, a spacer 34 made of an elastically compressible material is mounted between each sensor 18 and the cover 12, opposite the detection zone Z1, Z2, Z3, Z4 so as to take up the mechanical plays between the sensor 18 and the cover 12. Preferably, the four spacers 34 provided for the force sensors 18 are all formed by molding in a spacer plate 36 made of elastomeric material of silicone type.

It will be noted that, due to the relative rigidity of the cover 12 in the detection zone Z1, Z2, Z3, Z4, the operating plays, i.e. the axial displacements X1 of the cover 12 in the detection zone, can be smaller than the mechanical plays. The spacers 34 therefore allow the mechanical plays to be taken up in order to permit detection of the axial displacements X1 of the cover 12 due to tactile pressings.

Preferably, the thickness of the wall of the cover 12 is reduced in the detection zones Z1, Z2, Z3, Z4 so as to make this wall more easily deformable during a tactile pressing, the deformation having to be sufficient to allow detection of this pressing by the corresponding sensor 18.

In accordance with the embodiment shown, an intermediate plate 38 is arranged between the support 14 and the film 32 carrying the force sensors 18, and it is fixed directly behind the cover 16, independently of the support 14. More precisely, the spacer plate 36 and the film 32 are mounted axially compressed between the cover 16 and the intermediate plate 38 to allow the mounting of the force sensors 18 under prestress, i.e. for the force sensors 38 to be mounted, at rest, axially compressed.

The intermediate plate 38 is fixed behind the cover 16, for example by means of screws, which allows adjustment of the intensity of the prestressing force applied to the force sensors 18 independently of the mounting stresses of the cover 16 on the support 14, and independently of the fixing solutions of the cover 16 on the support 14, the intermediate plate 38 being pre-assembled on the cover 16.

The fact of prestressing the force sensors 18 by means of an intermediate plate distinct from the support 14 permits optimization of the structural characteristics of the intermediate plate 38 so that it optimally fulfills its bolster function, in particular by selecting a manufacturing method, a manufacturing material, a geometry particularly suited to this function. In particular this permits the application of tighter, or different, manufacturing tolerances to this intermediate plate without it being necessary to apply the same manufacturing tolerances to the support 14.

The intermediate plate 38 is designed to offer greater rigidity relative to the detection zones Z1, Z2, Z3, Z4 of the wall of the cover 16. It is advantageously injection molded from thermoplastic polymer filled with glass fiber size to obtain a sufficient rigidity for the bolster function while providing small manufacturing tolerances and good flatness of the bearing surface designed to be in contact with the force sensors 18. The intermediate plate 38 is made for example of Polybutadiene Terephthalate (PBT) filled with 30% glass fiber.

Advantageously, each spacer 34 includes, opposite the associated detection zone Z1, Z2, Z3, Z4 of the cover 12, at least one compressible portion 52 which is provided with a top surface 54 at the front and a bottom surface 56 at the rear. The top surface 54 here extends in a generally transversal plane, parallel with the rear face of the associated detection zone Z1, Z2, Z3, Z4 against which it bears axially. The bottom surface 56 also extends in a generally transversal plane, parallel with the plane of the film 32 carrying the force sensors 18. The top surface 54 has an area is smaller than the area of the bottom surface 56 size to minimize the reaction force applied by the spacer 34 to the cover 12 while ensuring even distribution of the prestressing force and of the tactile pressing force over the sensitive zone 30 of the sensor 18.

In accordance with the first embodiment shown in FIGS. 1 to 5, each spacer 34 is here formed by a single compressible portion 52 in the form of a truncated cone. This compressible portion 52 includes a cylindrical central cavity 58, or bore, which opens at each axial end and which is intended to allow the passage of a back-lighting light beam produced by a light source 60 arranged opposite the pictogram P1, P2, P3, P4 to be back-lit. Each light source 60 is here formed by an electroluminescent diode arranged on the printed circuit board 37, axially opposite the associated pictogram P1, P2, P3, P4.

In accordance with the embodiment shown, corresponding openings 61, 63 are formed in the thickness of the support 14 and in the thickness of the intermediate plate 38, opposite each cavity 58 and each light source 60, to allow the passage of light through the support 14 and through the intermediate plate 38, towards the associated pictogram P1, P2, P3, P4.

In accordance with a modified embodiment (not shown), one or more light guides can be used to transmit the light emitted by one or more electroluminescent diodes towards the pictograms P1, P2, P3, P4.

The outer and inner diameters of the bottom surface 56 of each compressible portion 52 are substantially identical to the outer and inner diameters of the associated annular sensitive zone 30 so that the bottom surface 56 is superimposed on the said sensitive zone 30.

It is noted that the film 32 carrying the force sensors 18 is here translucent so that the central part 62 of the annular sensitive zone 30 allows passage of a sufficient quantity of light to permit back-lighting of the axially associated pictogram P1, P2, P3, P4 through the film 32.

In accordance with modified embodiments (not shown), the central part 62 alone could be translucent or the central part 62 could be hollowed out in order to allow axial passage of light.

In accordance with an advantageous characteristic, each spacer 34 includes at least one transversal passage 64 allowing the inside of the central cavity 58 to communicate with the outside of the compressible portion 52. In accordance with the embodiment shown, each compressible portion 52 has two diametrically opposed grooves which are formed in the top surface 54. These transversal passages 64 are intended to prevent a "suction effect", i.e. the creation of an air bubble between the cover 12 and the film 32 on mounting of the compressible portion 52 in axial compression.

In accordance with the embodiment shown, the spacer plate 36 is provided with positioning means 66, 68 which are intended to ensure the centering of the spacer plate 36 relative to the cover 12 and in particular the centering of each spacer 34 opposite the associated sensitive zone Z1, Z2, Z3, Z4. The positioning means 66, 68 here include lugs 66 provided with bores which cooperate with screw barrels 70 arranged behind the cover 12. The positioning means 68 also include a peripheral rim 68, projecting towards the front, which extends along the outer peripheral edge of the spacer plate 36 and which cooperates with a complementary centering surface 72 formed in the rear face of the cover 12. The peripheral rim 68 also permits stiffening of the spacer plate 36 to facilitate its handling during assembly operations.

Advantageously, the film 32 and the intermediate plate 38 also include drilled lugs 74, 76 intended to cooperate with the screw barrels 70 in order to allow their centering relative to the cover 12.

Fixing screws 77 matched to the screw barrels 70 are here provided to fix the intermediate plate 38 against the cover 12.

A second embodiment of the control panel 10 in accordance with the invention will now be described with reference to FIGS. 6 to 8 which show diagrammatically a simplified control panel 10 of generally parallelepipedal form. This second embodiment here has no back-lighting device. Of course, this control panel 10 could adopt other forms suited to its arrangement in the passenger space of a vehicle and it could be provided with a back-lighting device.

In the example embodiment shown, the control panel 10 here includes six detection zones Z1, Z2, Z3, Z4, Z5, Z6 and therefore six associated spacers 34 on the spacer plate 36. The detection zones Z1, Z2, Z3, Z4, Z5, Z6 are here all identical and of rectangular forms.

Figure 5:
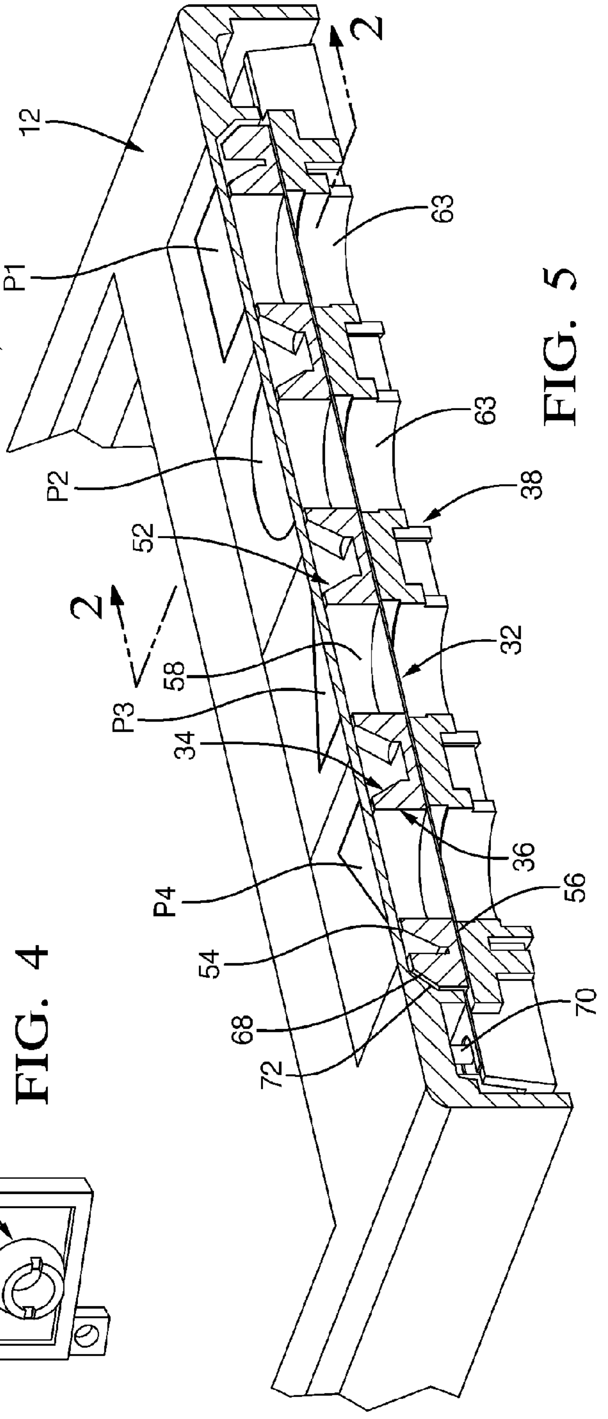
FIG. 5 is a perspective view in axial section along the plane 5-5 that shows a part of the control panel of FIG. 1.
Figure 4:
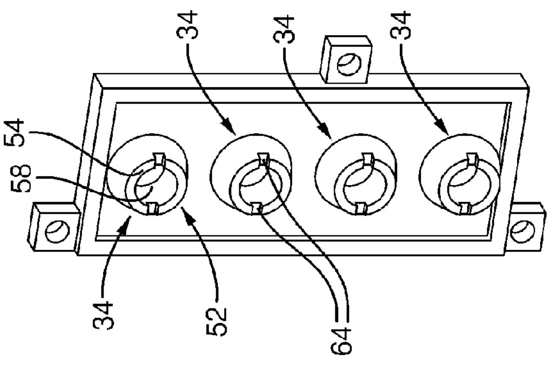
FIG. 4 is a perspective view that shows diagrammatically a spacer plate carrying a plurality of spacers and fitted to the control panel of FIG. 1.
Figure 6:
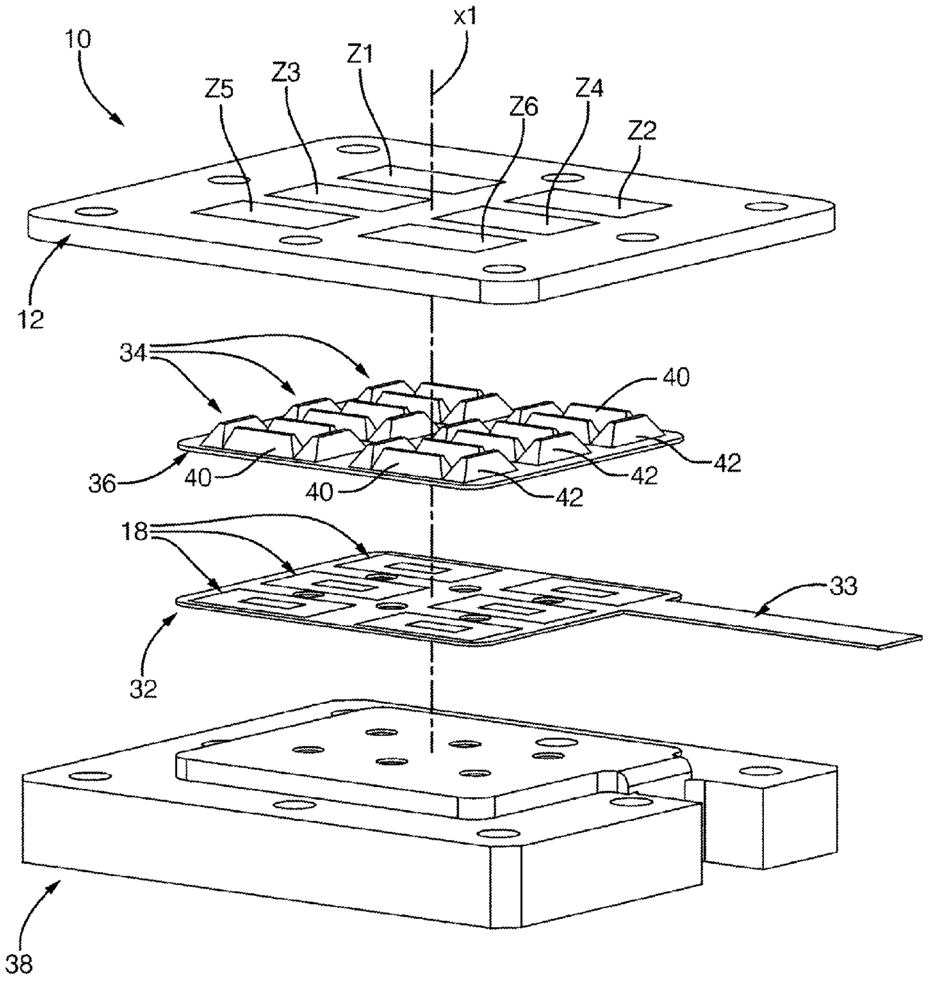
FIG. 6 is a perspective view which shows a control panel made in accordance with a second embodiment of the invention.

Within the framework of the second embodiment shown in FIGS. 4 to 6, each spacer 34 includes a plurality of compressible portions 40, 42. These compressible portions 40, 42 are here each in the form of a truncated pyramid elongated parallel with the plane of the cover 12. More precisely, each compressible portion 40, 42 here has two substantially trapezoidal lateral faces 46 and two substantially trapezoidal end faces 48 which meet at the top to form the top surface 44 which is substantially rectangular and designed to bear against the cover 12.

Advantageously, the compressible portions 40, 42 are distributed substantially parallel with the outer peripheral edge of the associated sensitive zone 30 of the sensor 18. Here, each sensitive zone 30 generally has a rectangular outer contour and the spacer 34 includes, opposite the sensitive zone 30, two longitudinal compressible portions 40 which extend in the length of the sensitive zone 30 and two transversal compressible portions 42 which extend in the width of the sensitive zone 30. The compressible portions 40, 42 are here contiguous, each longitudinal end edge of each longitudinal compressible portion 40 being adjacent to a transversal edge of a transversal compressible portion 42.

It is noted that the compressible portions 40, 42 of a determined spacer 34 are not contiguous at the top surfaces 44, in contact with the cover 12, so that transversal passages 54 are formed between these different top surfaces 44. These transversal passages 54 particularly allow the creation of an air bubble, between the spacer 34 and the cover 12, on assembly to be avoided.

Due to the particular structure of the spacers 34 in accordance with the invention, the bearing surface of the cover 12 on the spacers 34 is minimized since it is limited to the top surfaces 44 of the compressible portions 40, 42, 52. Due to the form of each compressible portion 40, 42, 52 which broadens towards its base, i.e. towards the sensitive zone 30 of the sensor 18, the axial prestressing and pressing force which is applied by the cover 12 to the top surface 44 is distributed over a larger area of the sensitive zone 30.

Advantageously, to obtain still more even distribution of the pressure on the sensitive zone 30, the bottom surface 56 of each spacer 34 can be provided with a plate 50 made of material more rigid than the material forming the spacer 34. Such a modified embodiment is shown in FIG. 8. The plate 50 is for example made of a relatively rigid thermoplastic material, compared with the elastomer material forming the spacer plate 36. The plate 50 can be made by over-molding with the said spacer plate 36. Each plate 50 preferably has a finer axial thickness than the axial thickness of the relief elements 40, 42 and it extends generally over the whole area of the associated sensitive zone 30 to distribute the pressure over the whole of the sensitive zone 30.

Figure 9:
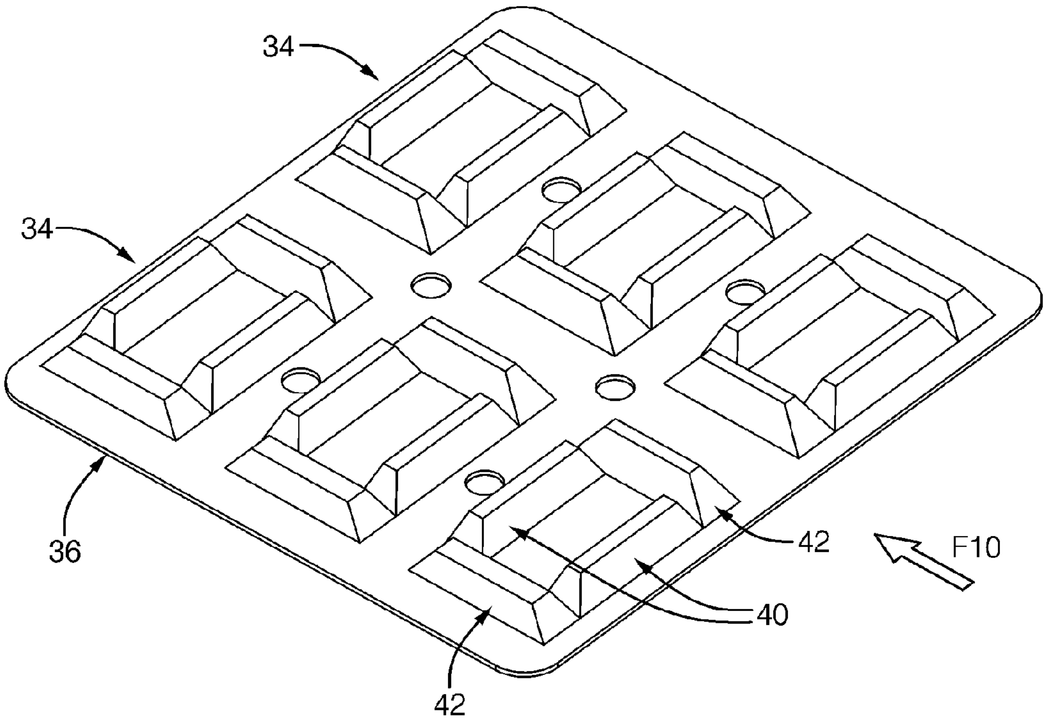
FIG. 9 is a view similar to that of FIG. 7 that shows a spacer plate corresponding to a third embodiment of the invention in which each spacer is provided with a plurality of compressible portions of different axial thicknesses.
Figure 10:
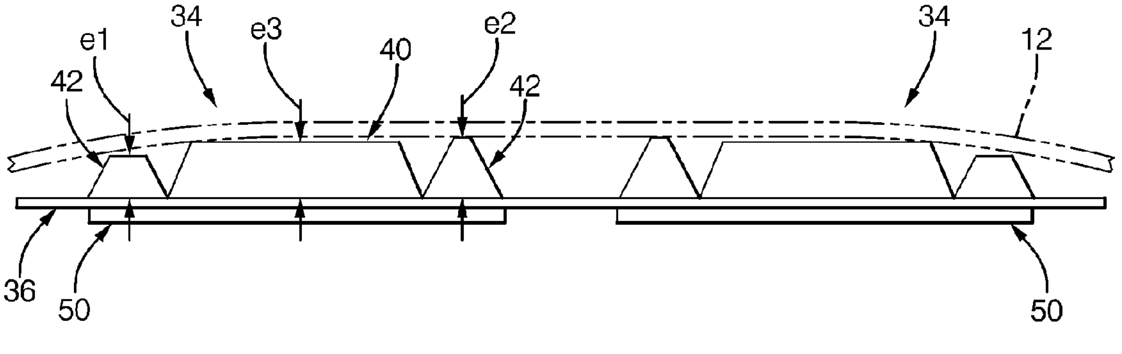
FIG. 10 is a side view in the direction of the arrow F10 that shows the spacer plate of FIG. 9.

In accordance with a third embodiment of the invention, which is shown in FIGS. 9 and 10, the compressible portions 40, 42 of a determined spacer 34 have distinct axial thicknesses matched to the height variations of the cover 12 relative to the sensor 18. The main differences between the third and the second embodiment will be described here, without detailing the common characteristics.

Figure 7:
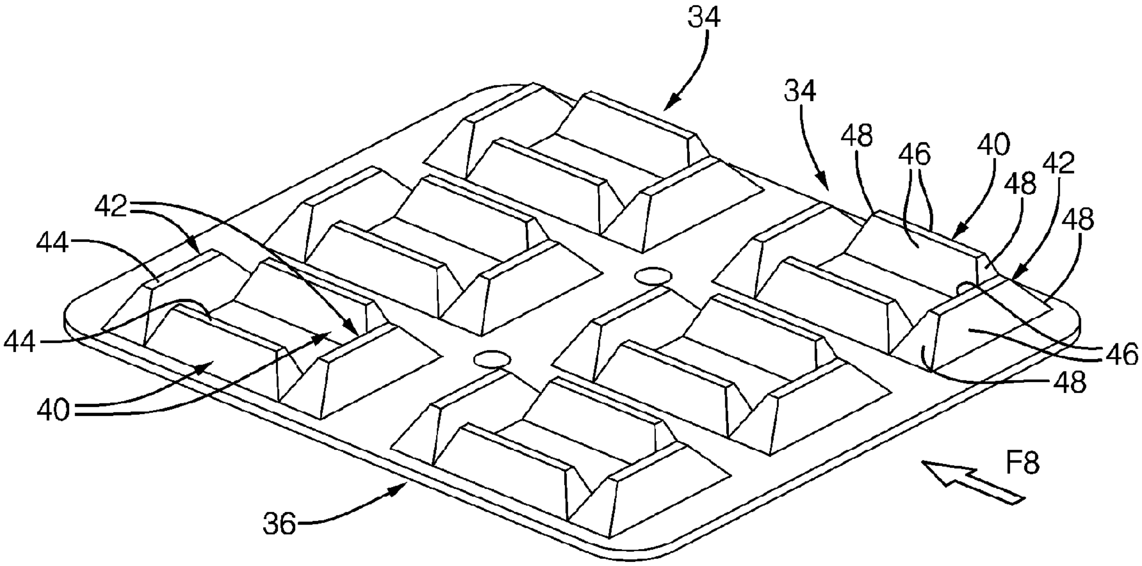
FIG. 7 is a perspective view that shows the spacer plate fitted to the control panel of FIG. 6.
Figure 8:
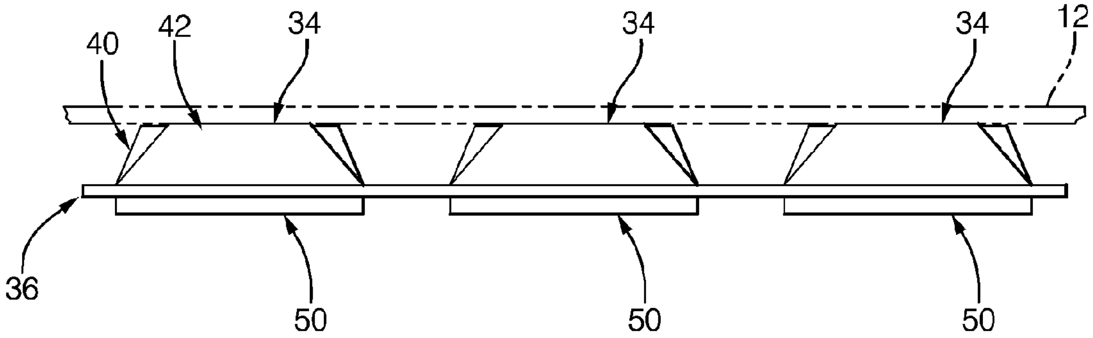
FIG. 8 is a side view in the direction of the arrow F8 that shows the spacers plate of FIG. 7.

In accordance with the example embodiment shown in FIGS. 9 and 10, the compressible portions 40, 42 generally have the same form and the same type of arrangement on the spacer plate 36 as in the second embodiment of FIGS. 6 to 8. However, considering for example the spacer 34 on the left of FIG. 10, the transversal compressible portion 42 situated in the proximity of the peripheral edge of the spacer plate 36 has an axial thickness e1 smaller than the axial thickness e2 of the transversal compressible portions 42 situated on the side opposite to the said peripheral edge. Moreover, the axial thickness e3 of the longitudinal compressible portions 40 has an intermediate value between the axial thickness is e1, e2 of the associated transversal compressible portions 42. This configuration here allows the curvature to be followed of the cover 12 which defines an axial space with the sensor 18 which is smaller in the proximity of the peripheral edge of the spacer plate 36 relative to the central part of the spacer plate 36. This configuration can also be suitable in the case in which, due to the structure of the cover 12, the pressure applied at rest by the cover 12 to the spacers 34 is greater in certain zones, for example in the proximity of fixing points of the cover 12 onto the support 14.

Thus, by means of the invention, it is possible to obtain a substantially even distribution of the prestressing force on the sensors 18, taking into account the curvature of the cover 12 opposite the intermediate plate 38 and/or the sensors 18, by selecting a suitable axial thickness for each compressible portion 40, 42 depending on its position on the spacer plate 36. The axial thickness is here adjusted by modifying the truncation height of the pyramidal form of each compressible portion 40, 42, without modifying the dimensions of the pyramidal form at its base and without modifying the gradient of its lateral faces 46, 48.

The invention permits optimization of the distribution of the pressure over the sensitive zone 30 by modifying, for each spacer 34, the distribution of the compressible portions 40, 42 and their height.

When the adjacent detection zones Z1, Z2, Z3, Z4, Z5, Z6 correspond to a thinned wall portion of the cover 12, this thinned wall portion offers greater flexibility to the other zones of the cover 12 which facilitates the detection of tactile pressings by the force sensors 18. Due to the distribution of the fixing points of the intermediate plate 38 on the cover 12 around the periphery of the thinned wall portion and due to the flexibility of this thinned wall portion, the pressure applied by the cover 12 to the spacers 34 tends to be greater at the periphery of the thinned wall portion relative to the center of the thinned wall portion. The adjustment of the height of the compressible portions 40, 42 permits compensation for the differences in pressure applied by the cover 12 to the spacers 34.

The control panel 10 has been described here with a plurality of control buttons B1, B2, B3, B4, B5, B6. Of course, the invention applies to modified embodiments including a single control button or a different number of control buttons.

The invention claimed is:

1. A control panel comprising:

a support;

a cover mounted on the support that defines at least one detection zone;

a force sensor having a pressure-sensitive zone arranged behind the detection zone between the cover and the support so as to detect the actuation of a control button to produce an electrical control signal when a user applies a determined tactile pressing force to the detection zone, wherein the tactile pressing force is transmitted axially towards the sensitive zone via a spacer made of elastically compressible material interposed between the force sensor and the cover, wherein the spacer is axially compressed between the sensor and the cover in the absence of tactile pressing on the detection zone so that the sensor (18) is subject to a prestressing force at rest, wherein the spacer includes at least one compressible portion that defines a transversal top surface that bears against the cover and a transversal bottom surface that bears against the sensitive zone of the sensor, the top surface having an area smaller than the area of the bottom surface so as to minimize the reaction force applied by the spacer to the cover while ensuring even distribution of the prestressing force and of the tactile pressing force over the sensitive zone of the sensor.

2. The control panel as described in claim 1, wherein the detection zone includes a back-lit zone configured to be back-lit through the spacer, wherein the spacer includes a central cavity configured to allow axial passage of light towards the illumination zone.

3. The control panel as described in claim 2, wherein the spacer includes at least one transversal passage that communicates the inside of the central cavity with the outside of the spacer.

4. The control panel as described in claim 2, wherein the sensitive zone has an annular form that defines a central space that corresponds to the form of the central cavity in order to facilitate the passage of light through the force sensor.

5. The control panel as described in claim 1, wherein the central cavity corresponds to a through hole defined by the spacer (34).

6. The control panel as described in claim 1, wherein the spacer includes a single compressible portion in the form of a truncated cone.

7. The control panel as described in claim 1, wherein the spacer includes a plurality of compressible portions.

8. The control panel as described in claim 7, wherein the compressible portions are distributed substantially parallel with the outer contour of the sensitive zone of the sensor.

9. The control panel as described in claim 8, wherein the sensitive zone has a rectangular outer contour and the spacer includes two compressible portions located opposite the sensitive zone and extend in the length of the sensitive zone and two compressible portions that extend in the width of the sensitive zone.

10. The control panel as described in claim 9, wherein each compressible portion has the form of a truncated and elongate pyramid having trapezoidal lateral faces and a rectangular top surface.

11. The control panel as described in claim 7, wherein the compressible portions associated with a determined sensitive zone have axial thicknesses matched to the height variations of the cover relative to the sensor.

12. The control panel as described in claim 1, wherein the spacer and the sensor are mounted axially compressed between the cover and an intermediate plate fixed directly onto the cover and independently of the support.

13. The control panel as described in claim 1, wherein the spacer is made in one piece with a transversal spacer plate, wherein the spacer plate defines positioning means that ensure of the spacer opposite the associated sensitive zone and opposite the associated detection zone.

14. The control panel as described in claim 13, wherein the spacer plate includes a plurality of spacers associated respectively with a plurality of detection zones.

15. The control panel as described in claim 1, wherein a plate made of more rigid material than the material forming the spacer is interposed between the spacer and the sensitive zone of the sensor in order to contribute to even distribution of the prestressing force and of the tactile pressing force over the sensitive zone of the sensor.

* * * * *